US012666727B2

(12) United States Patent
Liao et al.

(10) Patent No.:    US 12,666,727 B2
(45) Date of Patent:        Jun. 23, 2026

(54) METHOD FOR FORMING IMAGE SENSOR DEVICES

(71) Applicant: Taiwan Semiconductor Manufacturing Company, Ltd., Hsinchu (TW)

(72) Inventors: Keng-Ying Liao, Tainan City (TW); Huai-jen Tung, Tainan City (TW); Chih Wei Sung, Kaohsiung (TW); Po-Zen Chen, Tainan City (TW); Yu-chien Ku, Tainan City (TW); Yu-Chu Lin, Tainan (TW); Chi-Chung Jen, Kaohsiung City (TW); Yen-Jou Wu, Tainan City (TW); Tsun-Kai Tsao, Tainan City (TW); Yung-Lung Yang, Chiayi City (TW)

(73) Assignee: Taiwan Semiconductor Manufacturing Company, Lt, Hsinchu (TW)

( * ) Notice:    Subject to any disclaimer, the term of this patent is extended or adjusted under 35 U.S.C. 154(b) by 1002 days.

(21) Appl. No.: 17/873,845

(22) Filed: Jul. 26, 2022

(65)              Prior Publication Data

US 2022/0367559 A1      Nov. 17, 2022

Related U.S. Application Data

(63) Continuation of application No. 16/851,277, filed on Apr. 17, 2020, now Pat. No. 11,502,123.

(51) Int. Cl.
H10F 39/00          (2025.01)
H10F 39/12          (2025.01)
H10F 39/18          (2025.01)
(52) U.S. Cl.
CPC ......... H10F 39/014 (2025.01); H10F 39/184 (2025.01); H10F 39/199 (2025.01); H10F 39/807 (2025.01); H10F 39/811 (2025.01)

(58) Field of Classification Search
CPC ............................ H10F 39/014; H10F 39/811
See application file for complete search history.

(56)                References Cited

U.S. PATENT DOCUMENTS 6,756,303 B1 *    6/2004    Erb ...................... H10W 20/033
                                                                      438/653
9,536,810 B1 *    1/2017    Chiang ............... H10W 20/023
                       (Continued)

FOREIGN PATENT DOCUMENTS

DE        10 2019 116 605 A1      12/2019
DE        10 2019 114 944 A1      11/2020
                       (Continued)

OTHER PUBLICATIONS

Korean Office Action on KR Appl. Ser. No. 10-2020-0089080 dated Jan. 10, 2022 (17 pages).

*Primary Examiner* — Ali Naraghi
(74) *Attorney, Agent, or Firm* — Foley & Lardner LLP

(57)                    ABSTRACT
A method includes forming a dielectric layer over a first surface of a semiconductor layer, the dielectric layer including a metallization layer. The method includes forming an opening to expose a portion of the dielectric layer. The method includes forming a buffer oxide layer lining the opening. The method includes forming, according to a patternable layer, a recess in the buffer oxide layer partially extending from a second surface of the buffer oxide layer. The method includes removing the patternable layer. The method includes extending the recess through the buffer oxide layer and a portion of the dielectric layer to expose a portion of the metallization layer. The method includes filling the recess with a conductive material to form a pad structure configured to provide electrical connection to the metallization layer.

20 Claims, 15 Drawing Sheets

(56) References Cited

U.S. PATENT DOCUMENTS

| | | | |
|---|---|---|---|
| 9,704,827 B2 | 7/2017 | Huang et al. | |
| 2010/0244173 A1 | 9/2010 | Wang et al. | |
| 2011/0312127 A1 | 12/2011 | Ishizuka et al. | |
| 2013/0009270 A1 | 1/2013 | Tsai et al. | |
| 2013/0082281 A1* | 4/2013 | LaRoche | H10D 84/0165 |
| | | | 257/77 |
| 2015/0311247 A1 | 10/2015 | Chen et al. | |
| 2016/0365378 A1 | 12/2016 | Chiang et al. | |
| 2017/0062496 A1 | 3/2017 | Lai et al. | |
| 2017/0186602 A1* | 6/2017 | Yang | H10P 50/692 |
| 2017/0186802 A1* | 6/2017 | Huang | H10F 39/199 |
| 2017/0207182 A1 | 7/2017 | Ho et al. | |
| 2017/0229494 A1* | 8/2017 | Hsu | H10F 39/8057 |
| 2018/0342551 A1* | 11/2018 | Cheng | H10F 39/026 |
| 2019/0140010 A1 | 5/2019 | Ku et al. | |
| 2019/0393257 A1 | 12/2019 | Gambino et al. | |
| 2021/0111192 A1* | 4/2021 | Lee | H10D 87/00 |
| 2021/0408097 A1* | 12/2021 | Akiyama | H10F 39/809 |

FOREIGN PATENT DOCUMENTS

| | | | |
|---|---|---|---|
| JP | 2012-023356 A | 2/2012 | |
| KR | 20100052618 A | 5/2010 | |
| KR | 20130006248 A | 1/2013 | |
| KR | 20190052648 A | 5/2019 | |

* cited by examiner

METHOD FOR FORMING IMAGE SENSOR DEVICES

CROSS-REFERENCE TO RELATED APPLICATION

This application is related to and claims priority under 35 U.S. § 120 as a continuation application of U.S. Utility application Ser. No. 16/851,277, filed Apr. 17, 2020, titled "METHODS FOR FORMING IMAGE SENSOR DEVICES," the entire contents of which are incorporated herein by reference for all purposes.

BACKGROUND

The present disclosure generally relates to image sensor devices, and particularly to methods of making image sensor devices.

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as digital still cameras, mobile phones, tablets, goggles, etc. These image sensors utilize an array of pixels that absorb (e.g., sense) the incoming radiation and convert it into electrical signals. A back side illuminated (BSI) images sensor device is one example of image sensor devices. These BSI image sensor devices are operable to detect light from its backside.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
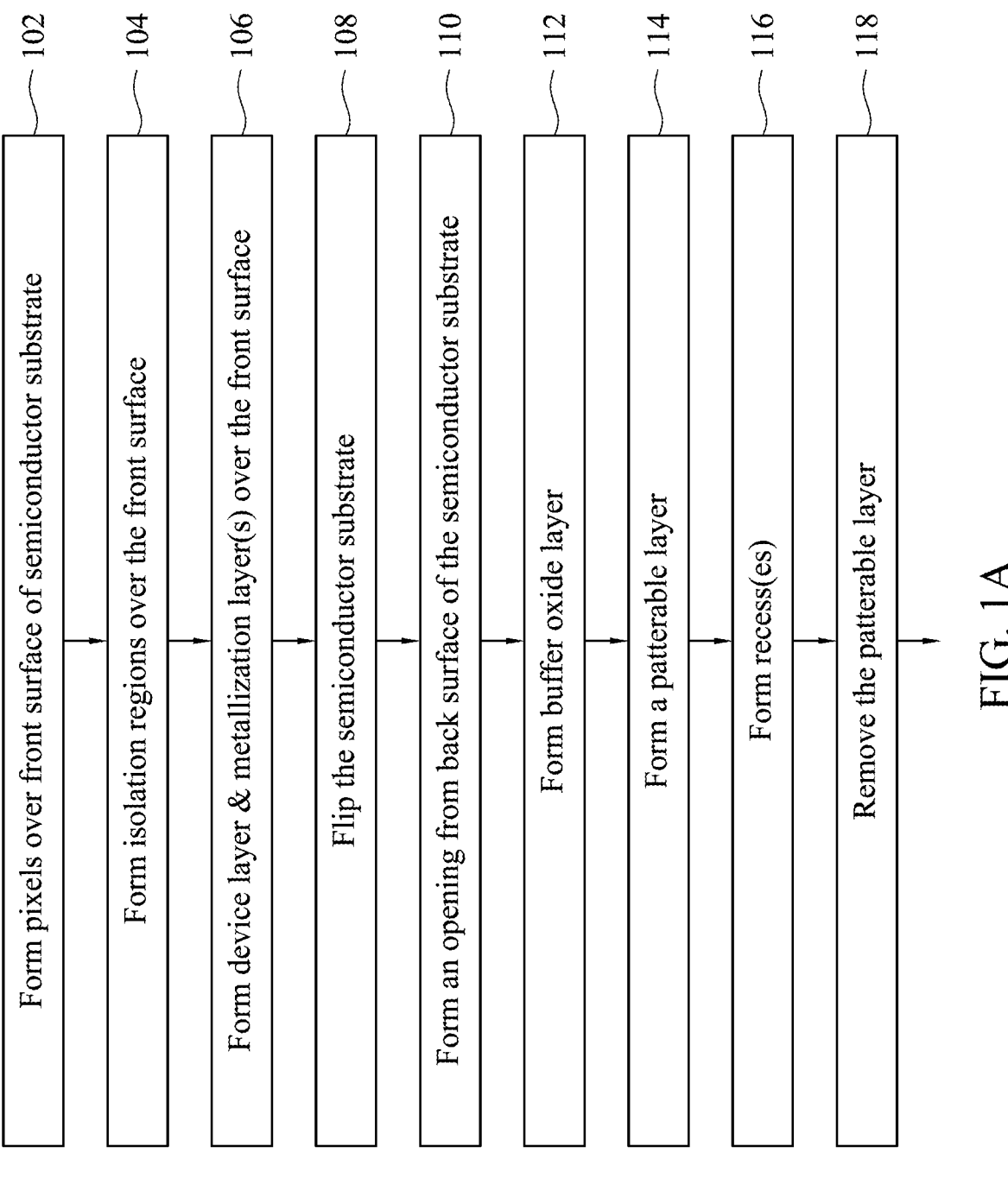
FIGS. 1A and 1B illustrate a flow chart of an example method for making an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" can indicate a value of a given quantity that varies within 5% of the value (e.g., ±1%, ±2%, ±3%, ±4%, ±5% of the value).

In general, a back side illuminated (BSI) image sensor device include a semiconductor substrate (e.g., silicon substrate) with pixels or radiation-sensing regions formed therein. As disclosed herein, the terms "radiation-sensing regions" and "pixels" may be used interchangeably. A BSI image sensor device can include a pixel array arranged within the semiconductor substrate. The pixel array is vertically arranged with respect to a multilevel metallization layer (e.g., one or more interconnect structures) formed on a first surface of the semiconductor substrate. The first surface of the semiconductor substrate is herein referred to as a "front side" or "front" surface of the semiconductor substrate. The pixel array extends into the semiconductor substrate and is configured to receive radiation from a second surface of the semiconductor substrate opposite to the front surface of the semiconductor substrate. This second surface of the semiconductor substrate that receives the radiation (and is opposite to the front surface of the semiconductor substrate) is herein referred to as a "back side" or "back" surface of the semiconductor substrate.

The pixels in the semiconductor substrate are electrically isolated with isolation structures, such as deep trench isolation (DTI) structures. Aligned to the aforementioned isolation structures (and formed on the back surface of the semiconductor substrate) are respective grid structures that provide optical isolation between neighboring pixels. Adjacent grid structures collectively form cells. Further, the cells collectively form a composite grid structure configured to receive color filtering material. Based on the above description, the composite grid structure is formed on the back surface of the semiconductor substrate.

Color filtering material can be disposed between adjacent grid structures to form color filters. The color filtering material can be selected such that light with a desired wavelength passes through the filtering material, while light with other wavelengths is absorbed by the color filtering material. For example, a green light filtering material receiving unfiltered natural light would allow the green light portion (wavelengths between about 495 nm and about 570 nm) to pass through the filter, but would absorb all the other wavelengths. The color filters are aligned to respective pixels to provide filtered light to corresponding pixels.

The components of the BSI sensor device (e.g., pixels, transistors, capacitors, memory structures, other chips attached to the BSI sensor device, etc.) can be electrically coupled to external devices (e.g., an external circuitry) through wire connectors attached to pad structures formed on the back surface of the semiconductor substrate. To achieve this, the pad structures of a BSI sensor device physically extend from the back surface of the semiconductor substrate to the front surface of the semiconductor substrate and electrically connect to the multilevel metallization layer of the BSI sensor. Therefore, the multilevel metallization layer of the BSI sensor device, which provides electrical signal connection to the BSI sensor device, can be electrically coupled to an external device or circuit through the pad structures. The pad structures can be disposed at the periphery of the BSI sensor device around the pixels or the radiation-sensing regions.

In existing technologies of forming the pad structure in a BSI image sensor device, an opening extending at least from the back side of to the front side of its semiconductor substrate needs to be formed, which is followed by a relatively thick patternable layer (e.g., a photoresist (PR) layer) filled in the opening to define a pattern of the pad structure. In certain applications of the BSI image sensor, a thickness of the semiconductor substrate shall be kept relatively thick. For example, when the BSI image sensor is configured to absorb near infrared radiation, the semiconductor substrate typically has a thickness of about 2 μm to about 8 μm. Without such a relatively great thickness, it may become challenging for the BSI image sensor to absorb radiation with wavelengths at infrared (IR). Moreover, to assure that undesired charges are not accumulated at certain regions of the BSI image sensor device, one or more high-k dielectric layers are typically formed on the back side of the semiconductor substrate. Accordingly, a thickness of the patternable layer can be significantly increased, e.g., up to 10 μm.

Such a thick patternable layer can cause various issues during the following processes. For example, undesired polymers (or PR residues) may remain along sidewalls of the opening, after the patternable layer being removed. To efficiently remove the patternable layer, an etching process using oxygen-based plasma can be used. Although the patternable layer may be thoroughly removed, such an oxygen-based plasma etching process can damage the underlying metallization layers. For example, while removing the patternable layer by the oxygen-based plasma, one of the metallization layers (e.g., a bottommost metallization layer) may have been exposed. The oxygen-based plasma may react with a barrier layer (e.g., TaN layer) surrounding the metallization layer, which can form air bubbles on an surface of the metallization layer. These air bubbles can disadvantageously facilitate penetration of etchants and/or acids into an interconnection structure of the metallization layer in the subsequent processes, which can damage the interconnection structure. Thus, the existing technologies of fabricating a BSI image sensor device are not entirely satisfactory.

The present disclosure provides various embodiments of methods for fabricating a BSI image sensor device to avoid such issues. For example, various embodiments of the method, as disclosed herein, include using a one patterning/two etching (1P2E) process to first partially etch a buffer oxide layer using a patternable layer to form one or more recesses and then etch through the one or more recesses to expose an underlying metallization layer. Prior to the metallization layer being exposed, the patternable layer that defines the recesses (and later the pad structures that connects to the metallization layer) has been removed. In other words, the metallization layer is protected from being damaged, for example, by the buffer oxide layer during a removal process of the patternable layer. As such, the compromise that the existing technologies encounter can be advantageously eliminated, which allows the patternable layer to be thoroughly removed and causes no (potential) damage to the metallization layer.

Figure 1B:
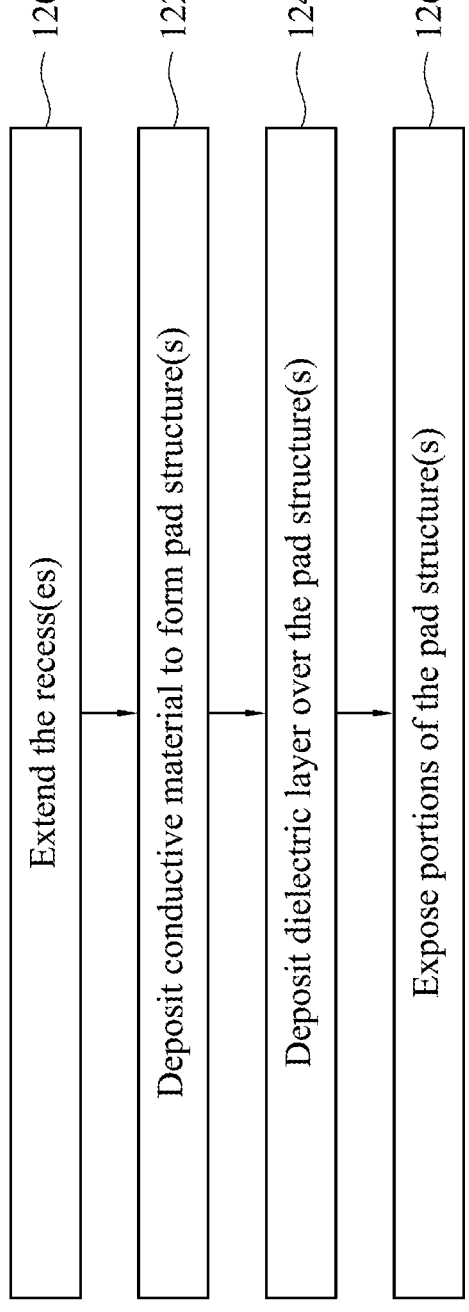

FIGS. 1A and 1B collectively illustrate a flowchart of a method 100 to form a BSI image sensor device, according to one or more embodiments of the present disclosure. It is noted that the method 100 is merely an example, and is not intended to limit the present disclosure. Accordingly, it is understood that additional operations may be provided before, during, and after the method 100 of FIGS. 1A-B, and that some other operations may only be briefly described herein. In some embodiments, operations of the method 100 may be associated with cross-sectional views of a BSI image sensor device at various fabrication stages as shown in FIGS. 2, 3, 4, 5, 6, 7, 8, 9, 10, 11, 12, 13, and 14, respectively, which will be discussed in further detail below.

In brief overview, the method 100 starts with operation 102 of forming a number of pixels (or radiation sensing regions) over the front surface of a semiconductor substrate. The method 100 continues to operation 104 of forming one or more isolation regions over the front surface. The method 100 continues to operation 106 of forming a device layer and one or more metallization layers over the front surface. The method 100 continues to operation 108 of flipping the semiconductor substrate. The method 100 continues to operation 110 of forming an opening from a back surface of the semiconductor substrate. The method 100 continues to operation 112 of forming a buffer oxide layer. The method 100 continues to operation 114 of forming a patternable layer. The method 100 continues to operation 116 of forming one or more recesses. The method 100 continues to operation 118 of removing the patternable layer. The method 100 continues to operation 120 of extending the one or more recesses. The method 100 continues to operation 122 of depositing a conductive material to form one or more pad structures. The method 100 continues to operation 124 of depositing a dielectric layer over the one or more pad structures. The method 100 continues to operation 126 of exposing respective portions of the one or more pad structures.

As mentioned above, FIGS. 2-14 each illustrates, in a cross-sectional view, a portion of a BSI image sensor device 200 at various fabrication stages of the method 100 of FIGS. 1A-B. FIGS. 2-14 are simplified for a better understanding of the concepts of the present disclosure. Although the figures illustrate the BSI image sensor device 200, it is understood the BSI image sensor device 200 may comprise a number of other devices such as inductors, fuses, capacitors, coils, etc., which are not shown in FIGS. 2-14, for purposes of clarity of illustration.

Figures 2, 3:
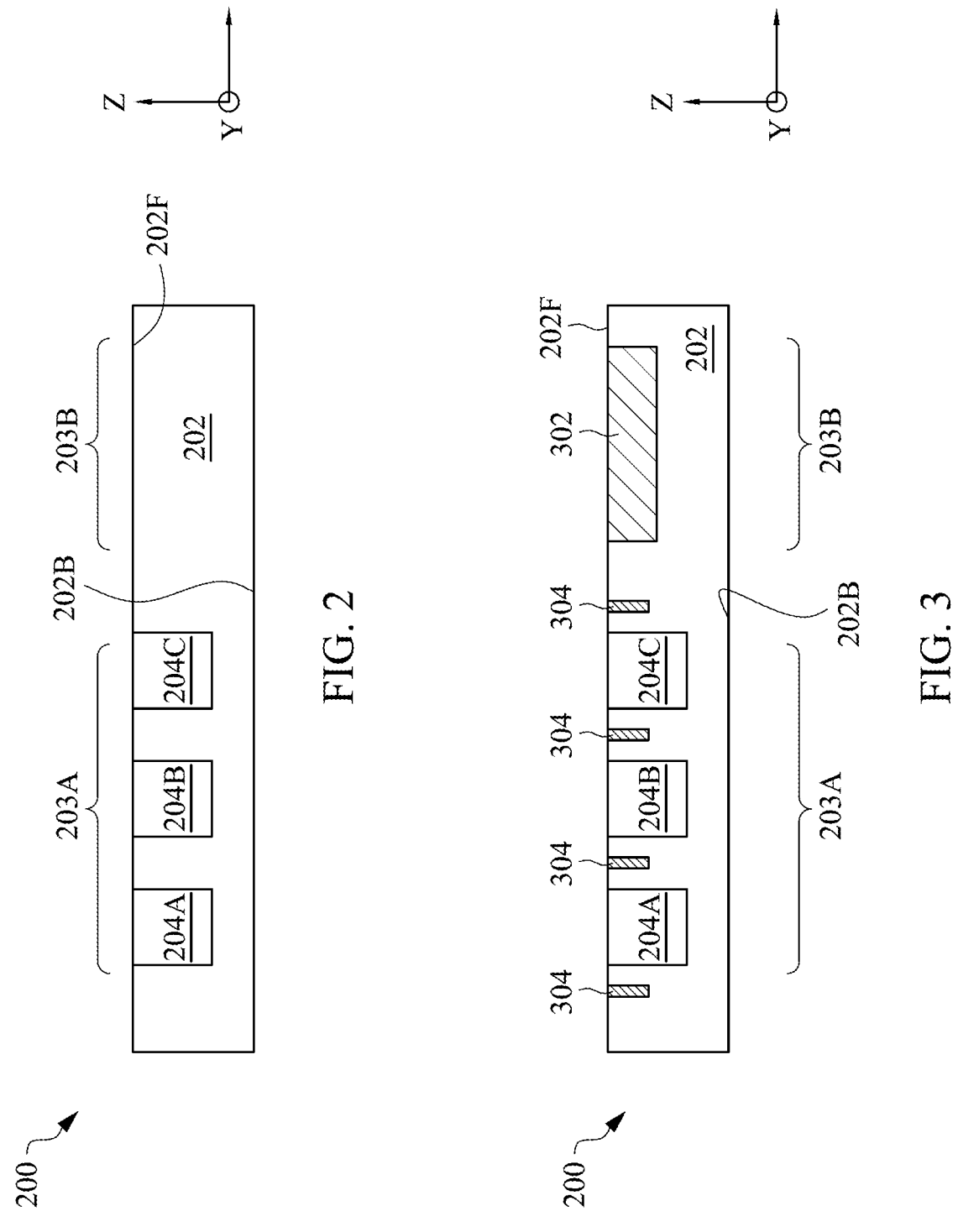
FIGS. 2, 3, 4, 5, 6, 7, 8, 9, 10, 11, 12, 13, and 14 illustrate cross-sectional views of an example image sensor device during various fabrication stages, made by the method of FIGS. 1A-B, in accordance with some embodiments.

Corresponding to operation 102 of FIG. 1A, FIG. 2 is a cross-sectional view of the BSI image sensor device 200 including a number of pixels, 204A, 204B, and 204C, formed over a front surface 202F of a semiconductor substrate (or semiconductor layer) 202 at one of the various stages of fabrication. Opposite to the front surface 202F (e.g., along the Z axis), the semiconductor substrate 202 has a back surface 202B, from which the BSI image sensor device 200 is configured to receive incident radiation.

The semiconductor substrate 202 can include a bulk semiconductor wafer or a top layer of a semiconductor on insulator wafer (SOI), with a thickness greater than about 6 μm (e.g., about 6.15 μm, about 6.30 μm, about 6.50 μm, and about 6.70 μm). For example, the semiconductor substrate 202 can include a semiconductor material such as silicon, germanium, a compound semiconductor, an alloy semiconductor, any other suitable semiconductor material, and/or combinations thereof. Further, the semiconductor substrate 202 can be an epitaxial material strained for performance enhancement and/or a doped with n-type dopants, p-type dopants, or combinations thereof. In various embodiments, the semiconductor substrate 202 can include combinations of p-type and n-type doped regions.

The pixels 204A-C are formed in a portion of the semiconductor substrate 202, which is herein referred to as a pixel region 203A. Although three pixels 204A-C are shown in FIG. 2 and the following cross-sectional figures, it shall be understood that the BSI image sensor device 200 can include any desired number of pixels while remaining within the scope of the present disclosure. In some embodiments, the pixel region 203A is a center region of the semiconductor substrate 202. For example, the pixel region 203A may correspond to a region where a pixel array is formed in the BSI image sensor device 200, as shown in the top view of FIG. 15.

The pixels 204A-C are each configured to sense electromagnetic radiation, such as near infrared light. By way of example and not limitation, each of the pixels 204A-C includes a photodiode structure, such as a pinned layer photodiode, a photogate, a reset transistor, a source follower transistor, a transfer transistor, any other suitable structure, and/or combinations thereof. Further, the pixels 204A-C may sometimes be referred to as "radiation-detection devices" or "light-sensors." In some embodiments, the pixels 204A-C are formed by doping the semiconductor substrate 202 from the front surface 202F. For example, the doping process can include doping the semiconductor substrate 202 with a p-type dopant, such as boron, or an n-type dopant, such as phosphorous or arsenic. In some embodiments, the pixels 204A-C are formed by a dopant diffusion process and/or an ion implantation process.

In some embodiments, the semiconductor substrate 202 includes a pad region 203B adjacent to the pixel region 203A. One or more pad structures can be formed in the pad region 203B. Such pad structures can be located at the periphery of semiconductor substrate 202 to surround the pixel region 203A. For example, the pad region 203B corresponds to a region where one or more pad arrays are formed in the BSI image sensor device 200, as shown in the top view of FIG. 15.

Corresponding to operation 104 of FIG. 1A, FIG. 3 is a cross-sectional view of the BSI image sensor device 200 including one or more isolation regions, 302 and 304, formed over the front surface 202F at one of the various stages of fabrication. In some embodiments, the isolation region 302, formed in the pad region 203B of semiconductor substrate 202, can facilitate formation of the one or more pad structures. In some embodiments, prior to, concurrently with, or subsequently to forming the isolation region 302 in the pad region 203B, one or more isolation regions 304 can be formed in the pixel region 203A. Such isolation regions 304 can isolate pixels 204A-C from each other. By way of example and not limitation, the isolation regions 302 and 304 can be formed over respective portions of the front surface 202F.

In some embodiments, the isolation regions 302 and 304 can be formed by performing at least some of the following processes: forming a patternable layer (e.g., a photoresist (PR) layer) with a pattern that defines respective locations of the isolation regions 302 and 304 in the semiconductor substrate 202; etching (e.g., dry etching) the semiconductor substrate 202 using the patternable layer as an etch mask to form recesses; removing (e.g., wet etching) the patternable layer; depositing one or more layers including, but not limited to, silicon oxide, USG, PSG, BPSG, PEOX, FSG, a low-k dielectric material (e.g., with a k value less than about 3.9), or combinations as a blanket layer to fill the recesses; planarizing (e.g., a chemical-mechanical polishing (CMP) process) the blanket layer.

Figure 4:
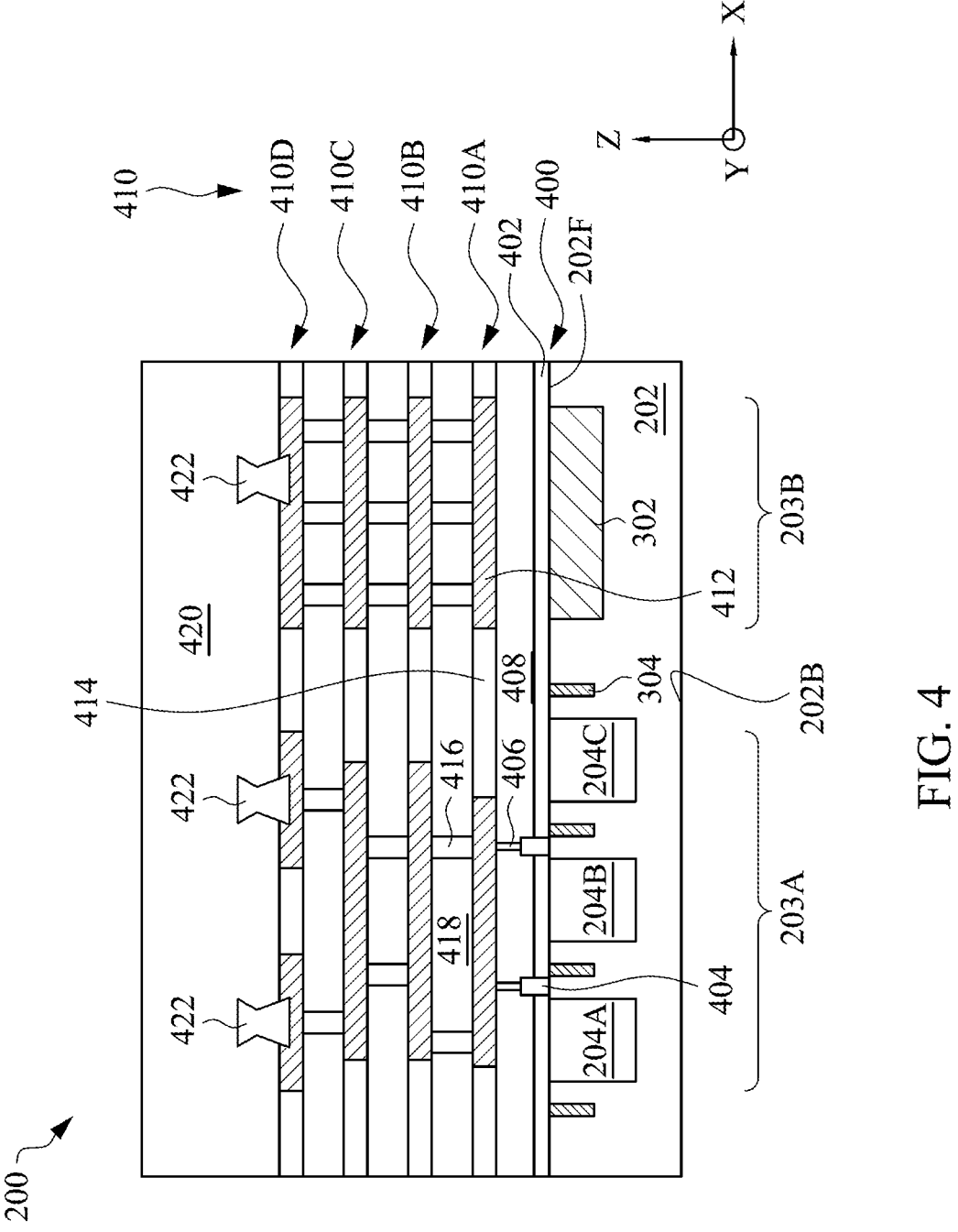

Corresponding to operation 106 of FIG. 1A, FIG. 4 is a cross-sectional view of the BSI image sensor device 200 including a device layer 400 and one or more metallization layers 410 at one of the various stages of fabrication. The device layer 400 and metallization layers 410 can be sequentially formed on the front surface 202F of the semiconductor substrate 202, in accordance with some embodiments. For example, the device layer 400 may be in contact with a certain portion of the front surface 202F.

The device layer 400 can include one or more semiconductor devices 404 (e.g., field effect transistors) formed according to a chip layout on front surface 202F of the semiconductor substrate 202. The device layer 400 may also include additional elements or structures, such as doped regions, dummy regions, epitaxial layers, capacitor structures, resistors, etc. These additional elements or structures of the device layer 400 are not shown in FIG. 4 for simplicity. In some embodiments, the BSI image sensor device 200 includes vertical conductive structures 406 (e.g., vias) that electrically connect the semiconductor devices 404 and other elements of the device layer 400 to upper metallization layers. The conductive structures 406 can form a portion of a middle of the line (MOL) wiring network. The ESL 402, semiconductor devices 404, and conductive structures 406 may be embedded or overlaid by a corresponding dielectric layer 408. In some embodiments, the device layer 400 further includes a nitride layer 402 that is used as an etch stop layer (ESL) in a subsequent etching operation during the formation of the pad structures. In some embodiments, the ESL 402 is formed around the semiconductor devices 404, but not between the semiconductor devices 404 and the semiconductor substrate 202.

The metallization layers 410 can include one or more metallization layers, such as metallization layers 410A, 410B, 410C, and 410D, as shown in FIG. 4. It shall be understood that the image sensor device 200 can include any desired number of metallization layers while remaining within the scope of the present disclosure. In some embodiments, the metallization layer 410A is a first metallization layer (sometimes referred to as "Ml" layer) and the metallization layer 410D is a top metallization layer (sometimes referred to as "top metal (TM)" layer). The metallization layers 410 can form a portion of a back end of the line (BEOL) wiring network. Each of the metallization layers 410 (e.g., 410A-D) can include one or more lateral conductive structures 412 (e.g., lines) embedded in a corresponding dielectric layer 414. In some embodiments, the corresponding dielectric layer and lines embedded therein may be collectively referred to as a metallization layer. Across different metallization layers 410, one or more vertical conductive structures 416 (e.g., vias) can be extended through a corresponding dielectric layer 418 to electrically connect adjacent metallization layers along the Z axis. The lines 412 and vias 416, formed of copper, for example, may sometimes be referred to as copper interconnect structures. In some embodiments, each of the copper lines 412 and copper vias 416 may be surrounded by a (diffusion) barrier layer. The barrier layer can include a material selected from a group consisting of: tantalum (Ta), tantalum nitride (TaN), titanium nitride (TiN), titanium tungsten (TiW), and titanium (Ti). In some embodiments, such a barrier layer may sometimes be referred to as a part of the corresponding metallization layer.

The dielectric layers 408, 414, and 418 can electrically isolate the elements and/or structures therein. In some embodiments, each of the dielectric layers 408, 414, and 418 is an interlayer dielectric (ILD) or inter-metal dielectric (IMD) layer. For example, such an ILD or IMD layer includes silicon oxide, USG, BPSG, a low-k dielectric (e.g., with a dielectric constant lower than 3.9), or a stack of dielectrics—such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide.

In some other embodiments, the device layer 400 and/or the metallization layers 410 can be formed on a separate semiconductor substrate (e.g., different from the semiconductor substrate 202) and be subsequently attached to front surface 202F of the semiconductor substrate 202.

In certain application of the image sensor device 200, an application specific integrated circuit (ASIC) and/or a silicon-on-chip (SoC) 420 can be attached to the top metallization layer 410D. Such a structure may sometimes be referred to as a three-dimensional (3D) stack, or 3D integrated circuit. In this regard, one or more bonding structures 422 can be used to electrically and mechanically bond the ASIC/SoC 420 to the top metallization layer 410D. The ASIC/SoC 420 can add functionality to the image sensor device 200 or may control functions of the image sensor device 200. In some embodiments, the ASIC/SoC 420 includes metallization layers, semiconductor devices, memory devices, or can be a stack of chips such as memory chips, central processing unit (CPU) chips, other functional chips (e.g., RF chips), or combinations thereof.

In accordance with some embodiments, fabrication of the BSI image sensor device 200 may continue with forming additional structures in or on the semiconductor substrate 202 from the back surface 202B. For this reason, partially-fabricated image sensor 200 can be rotated 180° (flipped) around the x-axis, as shown in FIG. 5 that also corresponds to operation 108 of FIG. 1A.

Upon flipping the semiconductor substrate 202, one or more isolation regions 504, aligned to the isolation regions 304, are formed to further isolate the pixels 204A-C in the pixel region 203A. The solation regions 504 may include one or more dielectric materials and, for example, form deep trench isolation (DTI) structures. The isolation regions 504 can be formed by etching semiconductor substrate 202 to form respective trenches between the pixels 204A-C. The trenches are subsequently filled with one or more dielectric materials. Although not shown in FIG. 5, subsequently to forming the isolation regions 504, one or more high-k (with a dielectric constant higher than 3.9) dielectric layers can optionally be formed over the isolation regions 504. For example, the high-k dielectric layers can each include a material selected from: $Ta_2O_5$, $HfO_2$, $Al_2O_3$, and combinations thereof. Such a high-k dielectric layer can be configured to dissipate the charges accumulated in the BSI image sensor device 200.

In some embodiments, the dielectric layers (e.g., including the dielectric layers forming the isolation regions 504 and the optional high-k dielectric layer(s)) can overlay both of the pixel region 203A and the pad region 203B of the semiconductor substrate 202. Prior to forming the isolation regions 504 on the back surface 202B, the semiconductor substrate 202 may be thinned to a desired thickness $T_1$. By way of example and not limitation, thickness $T_1$ can range from about 2 μm to about 6 μm, depending on the application of the BSI image sensor device 200. Thus, it shall be understood that the thickness, $T_1$, can range from and to any suitable values while remaining within the scope of the present disclosure. The thinning of semiconductor substrate 202 may be performed by a planarization process (e.g., a CMP process), an etch-back process (e.g., a dry etching process), some other thinning process (e.g., grinding), or a combination thereof. Thinning of semiconductor substrate 202 can facilitate formation of the isolation regions 504 and the subsequent formation of the pad structure(s).

Figure 5:
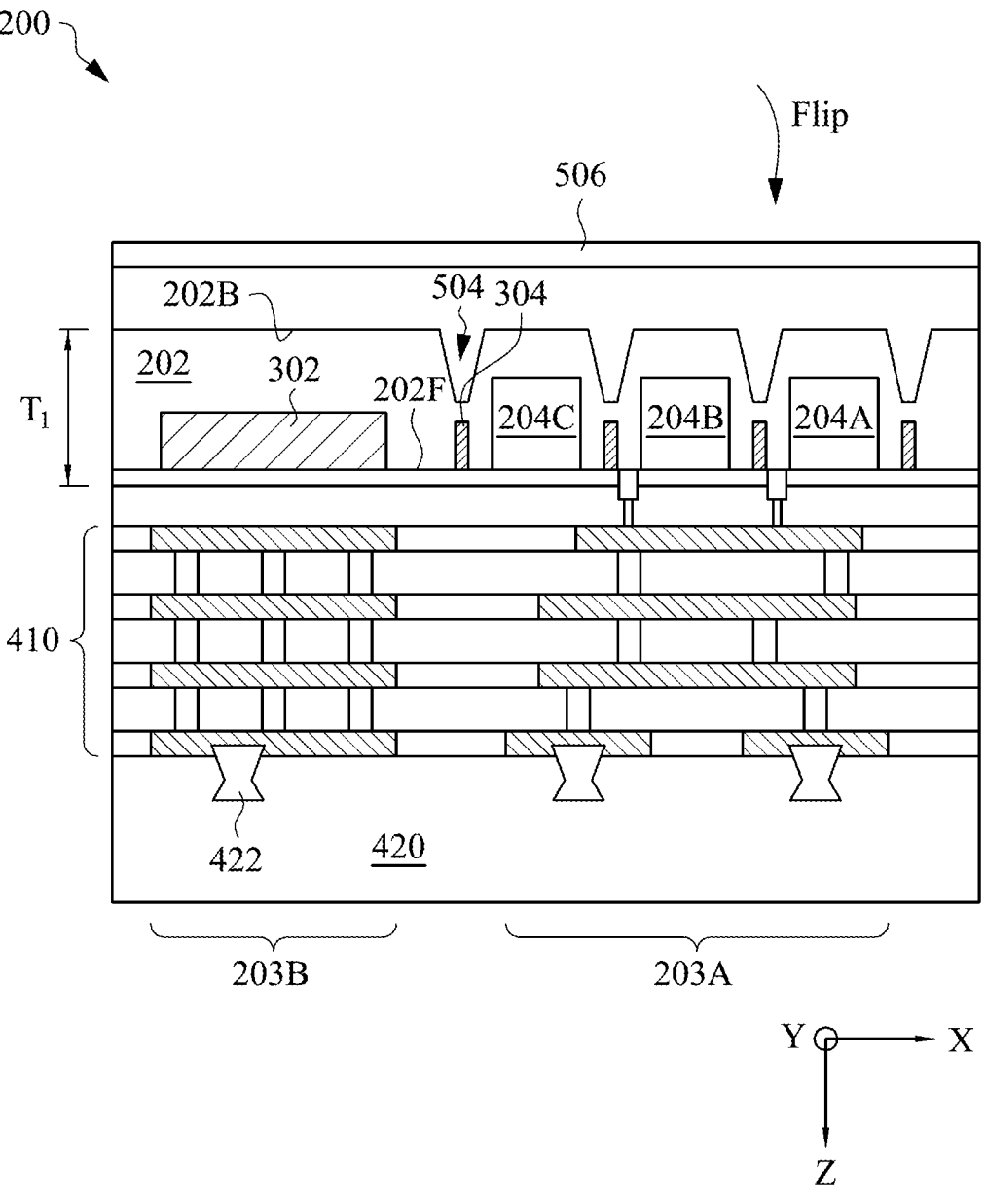

Subsequently to forming the isolation regions 504 (and the optional high-k dielectric layers) on the back surface 202B, a passivation layer 506 can be deposited over the back surface 202B, as shown in FIG. 5. The passivation layer 506 can be a dielectric layer such as, for example, silicon oxide, silicon nitride, or a combination thereof. In some embodiments, the passivation layer 506 is a protective layer or a hard mask (HM) layer grown or deposited on both of the pixel region 203A and the pad region 203B.

Figure 6:
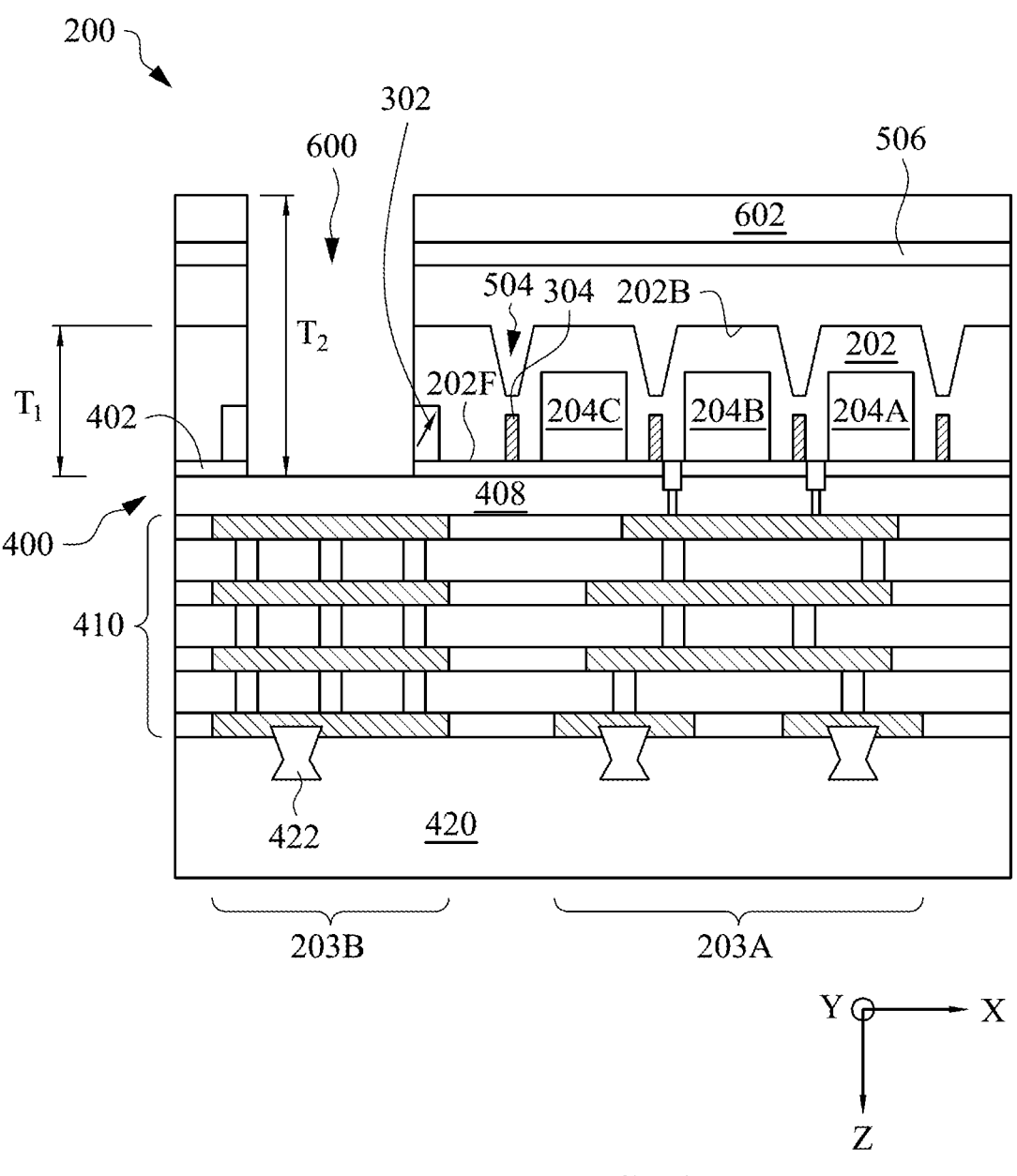

Corresponding to operation 110 of FIG. 1A, FIG. 6 is a cross-sectional view of the BSI image sensor device 200 including an opening 600 at one of the various stages of fabrication. The opening 600 is formed in the pad region 203B to expose a portion of the dielectric layer 408. As shown, the opening 600 may extend through at least the passivation layer 506, the dielectric layer(s) of the isolation regions 504, the semiconductor substrate 202, the isolation region 302, and the ESL 402. In the example where the thinned semiconductor substrate 202 has a thickness $T_1$ of about 6 μm, the opening 600 can be characterized with a depth, $T_2$, that is substantially greater than 6 μm. It shall be understood that the depth of the opening 600 can range from and to any suitable values, in accordance with the thickness of the thinned semiconductor substrate 202.

The opening 600 can be formed by performing at least some of the following processes: forming a patternable layer (e.g., a photoresist (PR) layer) 602 over the passivation layer 506; patterning the patternable layer 602 in the pad region 203B to expose a portion of the passivation layer 506 aligned with isolation region 302; etching (e.g., one or more dry etching processes) the passivation layer 506, the dielectric layer(s) of the isolation regions 504, the semiconductor substrate 202, the isolation region 302, and the ESL 402 to expose a portion of the dielectric layer 408; removing the patternable layer 602. Specifically, the dry etching processes may use one or more different etching gases. For example, the material of semiconductor substrate 202 (e.g., silicon) can be etched by a first dry etching process with a gas mixture of chlorine ($Cl_2$) and HBr, which endpoints on the isolation region 302. In some embodiments, such a first dry etching process etches between about 200 Å and 300 Å of material from the isolation region 302 before it is endpointed. Subsequently, a second dry etching process—e.g., using tetrafluoromethane ($CF_4$) gas—removes the isolation region 302 and endpoints on the ESL 402. A third dry over-etch process—e.g., using octafluorocyclobutane ($C_4F_8$) gas—removes the ESL 402 to expose the dielectric layer 408 of the device layer 400, as shown in FIG. 6. In other words, the one or more etching processes may be terminated when at least a portion of the dielectric layer 408 of the device layer 400 in the pad region 203B is exposed through the opening 600.

Figure 7:
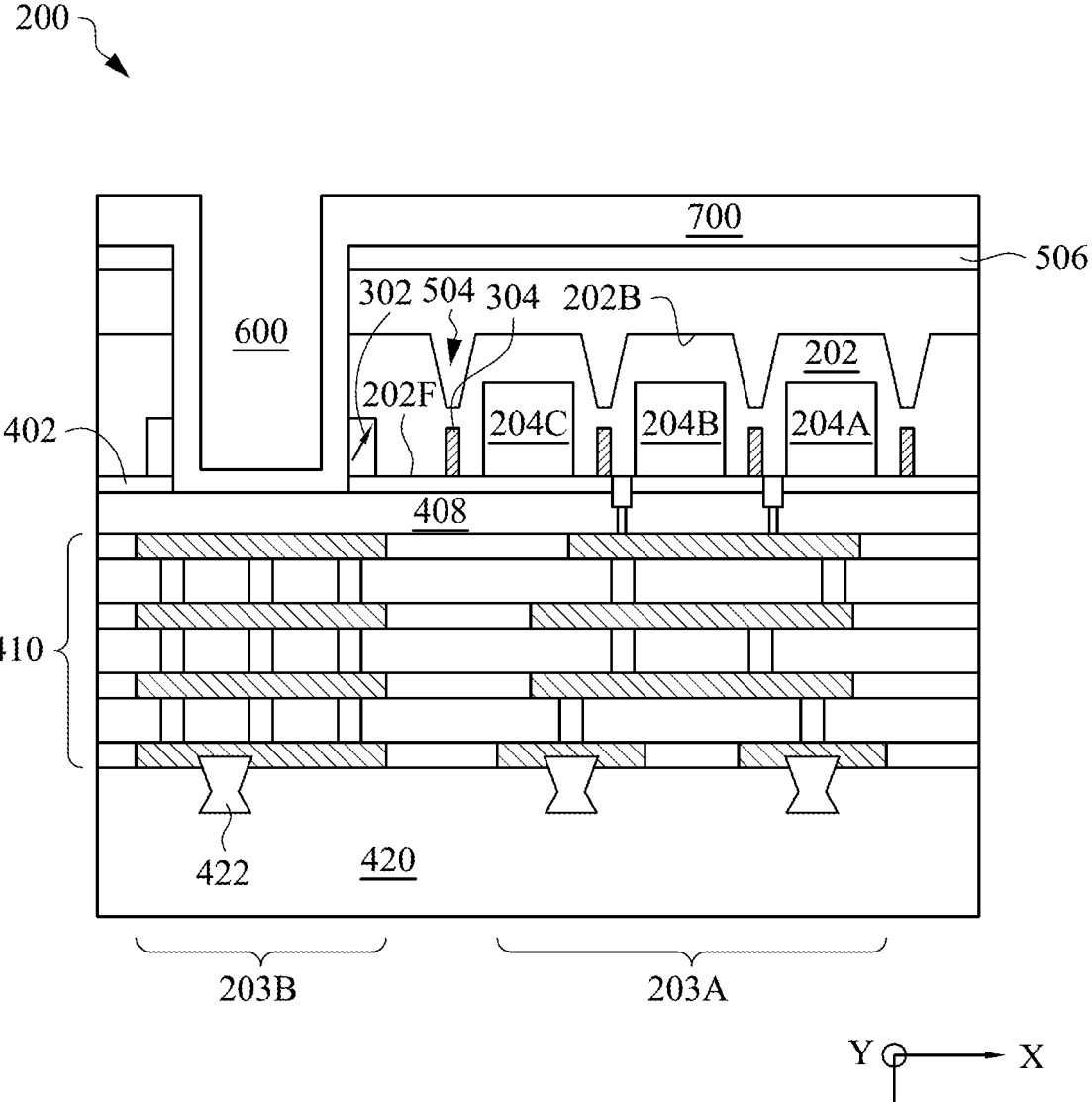

Corresponding to operation 112 of FIG. 1A, FIG. 7 is a cross-sectional view of the BSI image sensor device 200 including a buffer oxide layer 700 at one of the various stages of fabrication. After removing the patternable layer 602 (FIG. 6), the buffer oxide layer 700 can be conformally deposited to line the opening 600 (e.g., extending across a bottom surface and sidewalls of the opening 600) and overlay the exposed surface of the dielectric layer 408 and the passivation layer 506, as shown in FIG. 7. In some embodiments, the buffer oxide layer 700 is a silicon oxide dielectric, such as a PEOX, with a thickness range between about 100 nm and about 700 nm. It shall be understood that the thickness of the buffer oxide layer 700 can range from and to any suitable values while remaining within the scope of the present disclosure. In some other embodiments, the buffer oxide layer 700 includes a material selected from USG, PSG, BPSG, FSG, a low-k dielectric material, and combinations thereof.

Figure 8:
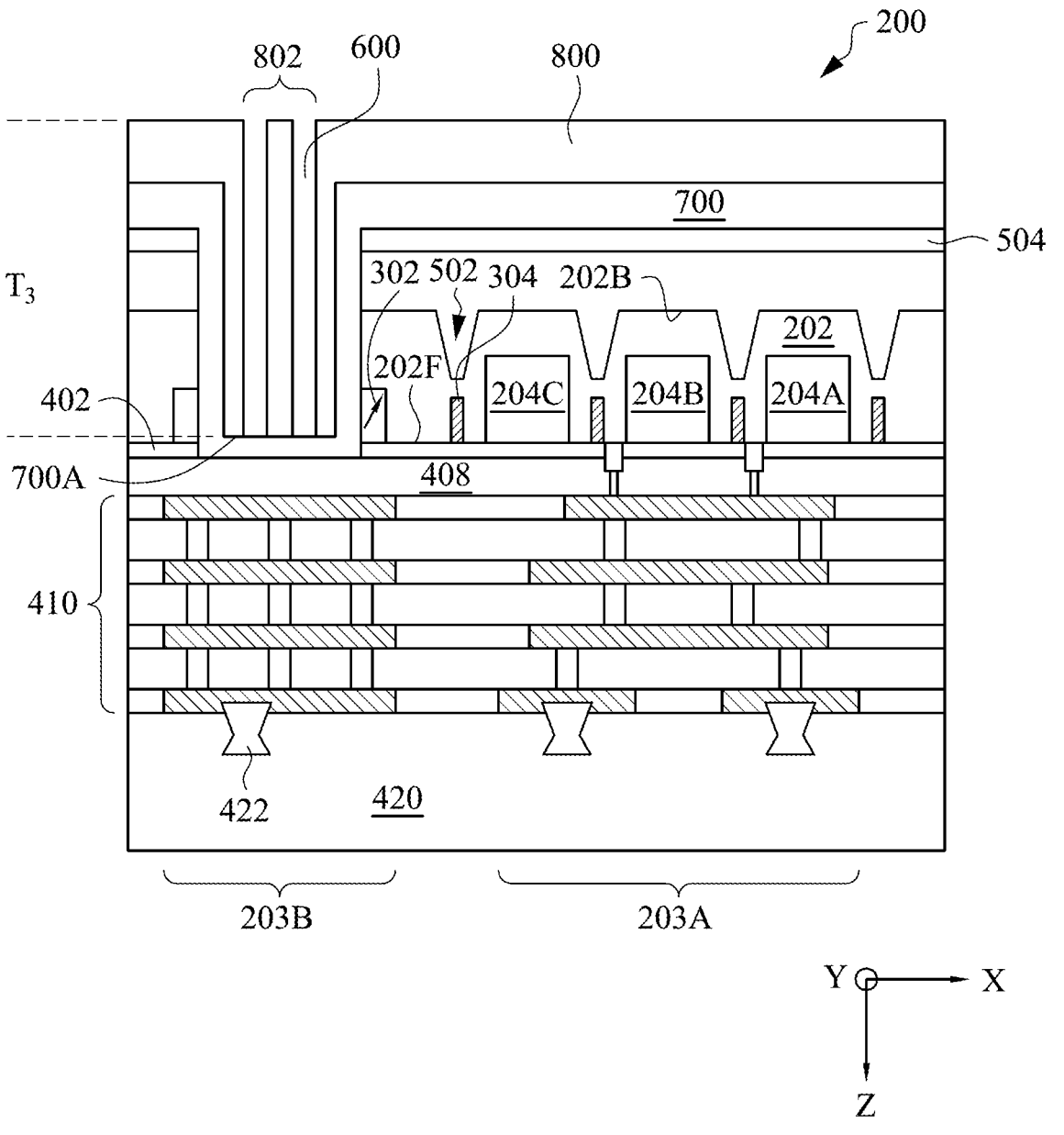

Corresponding to operation 114 of FIG. 1A, FIG. 8 is a cross-sectional view of the BSI image sensor device 200 including a patternable layer (e.g., a photoresist (PR) layer) 800 that includes a pattern 802 in the opening 600 at one of the various stages of fabrication. In some embodiments, the pattern 802 may be used to form one or more pattern structures in the opening 600, which shall be discussed in further detail below. The patternable layer 800 may be formed by first depositing (e.g., spin coating) a blanket photoresist layer over the buffer oxide layer 700; and patterning the blanket photoresist layer to form the pattern (one or more openings) 802 in the opening 600 that expose one or more portions of a surface 700A of the buffer oxide layer 700. In some embodiments, in order to fill the opening 600, which is characterized with a relatively deep depth $T_2$ (e.g., over 6 μm), at least the portion of the blanket photoresist layer in the opening 600 shall be formed to have a thickness substantially greater than 6 μm, e.g., about 8-10 μm. As such, the pattern 802 may be characterized with a thickness, $T_3$, that is about 8-10 μm.

Figure 9:
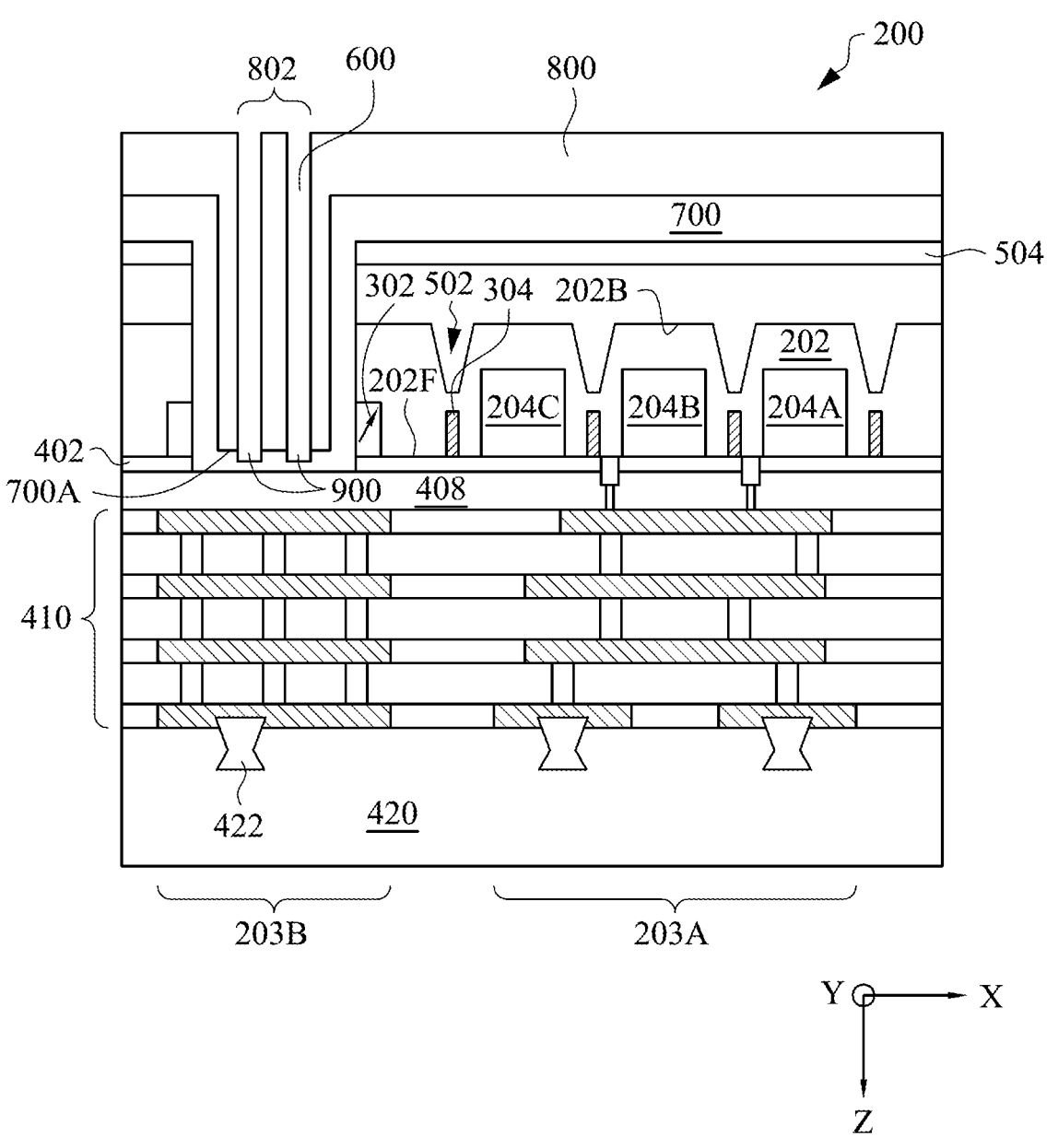

Corresponding to operation 116 of FIG. 1A, FIG. 9 is a cross-sectional view of the BSI image sensor device 200 including one or more recesses 900 at one of the various stages of fabrication. In some embodiments, the recesses 900 are formed by performing one or more dry etching processes (e.g., using tetrafluoromethane ($CF_4$) gas) to remove upper portions of the buffer oxide layer 700 in the opening 600, with the patternable layer 800 as an etchant mask. In other words, the buffer oxide layer 700 is partially etched to form the recesses 900 that are aligned with the pattern 802. As such, each of the recesses 900 may have a depth relatively shallower than the thickness of the buffer oxide layer 700. For example, a ratio of the depth of the recesses 900 to the thickness of the buffer oxide layer 700 may range from 0.1 to 0.8. In the opening 600, as only the upper portions of the buffer oxide layer 700 that are exposed by the pattern 802 are removed, the surface 700A in the opening 600 may be characterized with a non-coplanar surface.

Figure 10:
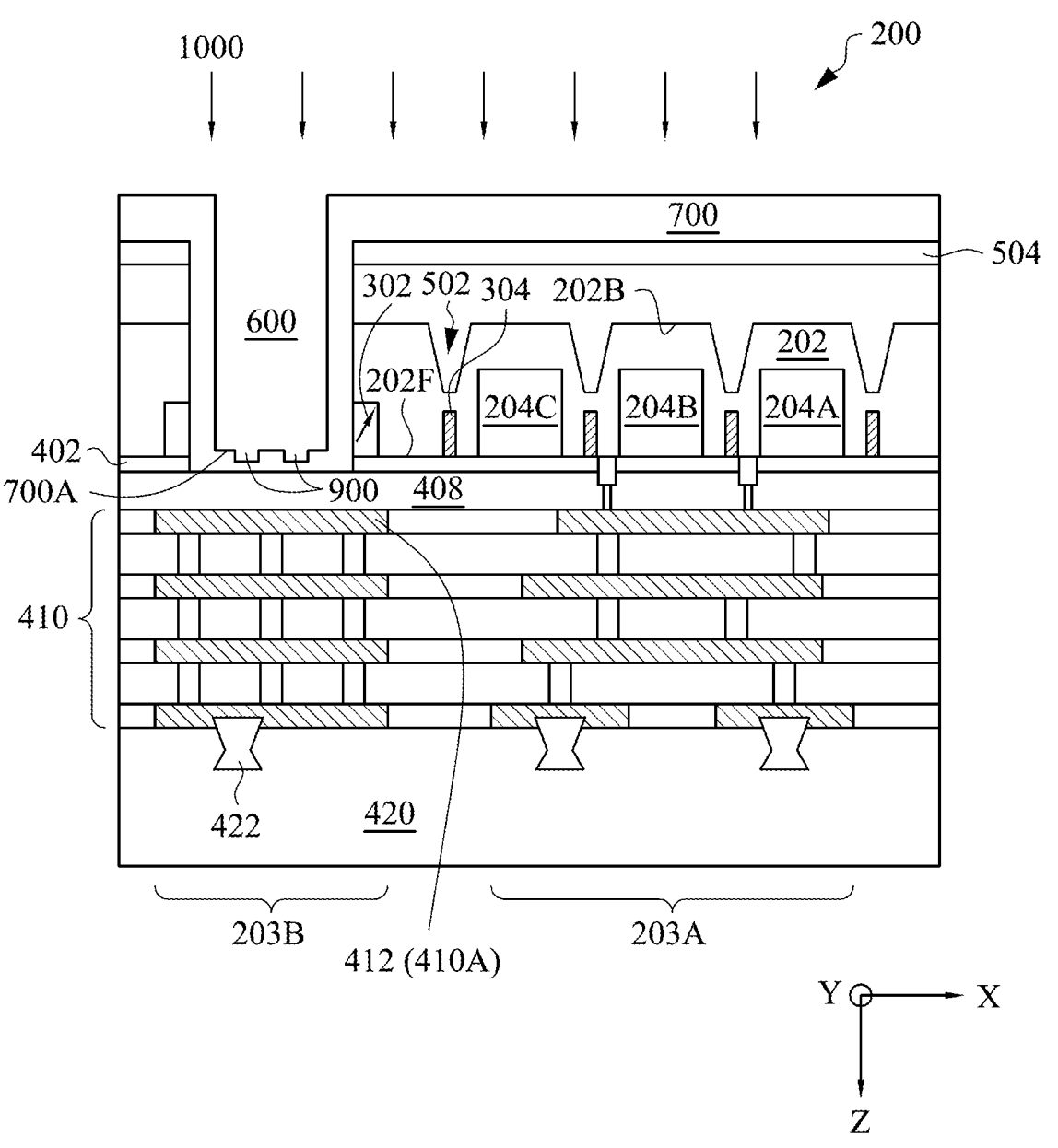

Corresponding to operation 118 of FIG. 1A, FIG. 10 is a cross-sectional view of the BSI image sensor device 200 in which the patternable layer 800 is removed at one of the various stages of fabrication. In some embodiments, as the patternable layer 800 is characterized with a relatively great thickness, the patternable layer 800 may be removed by performing an ashing process 1000 using oxygen-based plasma, in which oxygen plasma is created by utilizing an oxygen source on a plasma system. It is understood that any of various other ashing processes (e.g., using other gaseous sources), which is either plasms-based or non-plasma-based, may also be used while remaining within the scope of the present disclosure. In some embodiments, removing the patternable layer 800 (operation 118) may be performed in situ with forming the one or more recesses 900 (operation 116). As such, the BSI image sensor device 200 may be placed in the same chamber at operations 116-118. In some other embodiments, removing the patternable layer 800 (operation 118) may be performed ex situ with forming the one or more recesses 900 (operation 116). As such, the BSI image sensor device 200 may be placed in respective different chambers at operations 116-118.

In the existing technologies, the metallization layer that is intended to be connected to later formed pad structures has typically been exposed prior to removing a corresponding patternable layer. Thus, while removing the patternable layer (e.g., using an oxygen-based plasma ashing process), a barrier layer (e.g., TaN layer) surrounding the metallization layer may react with the oxygen to oxidize the barrier layer, thereby forming air bubbles over a surface of the barrier layer. Such air bubbles are subjected to reacting with etchant gases (e.g., fluoride-based gases) used in the following processes, which can disadvantageously penetrate through the barrier layer to expose the metallization layer in some of the following processes. In turn, the underlying metallization layer can be damaged, thereby significantly increasing the likelihood of eletromigration in such a damaged metallization layer and/or corresponding interconnection interface(s). By contrast, while removing the patternable layer 800 using the oxygen plasma, the metallization layers 410 (e.g., specifically the line 412 in the metallization layer 410A intended to be connected to later formed pad structures) are not exposed. Rather, the metallization layers 410 are protected against the oxygen plasma by at least the buffer oxide layer 700. As such, the fabrication method (e.g., 100), as disclosed herein, can thoroughly remove the relatively thick patternable layer used to form pad structures while keeping the underlying metallization layer intact.

Figure 11:
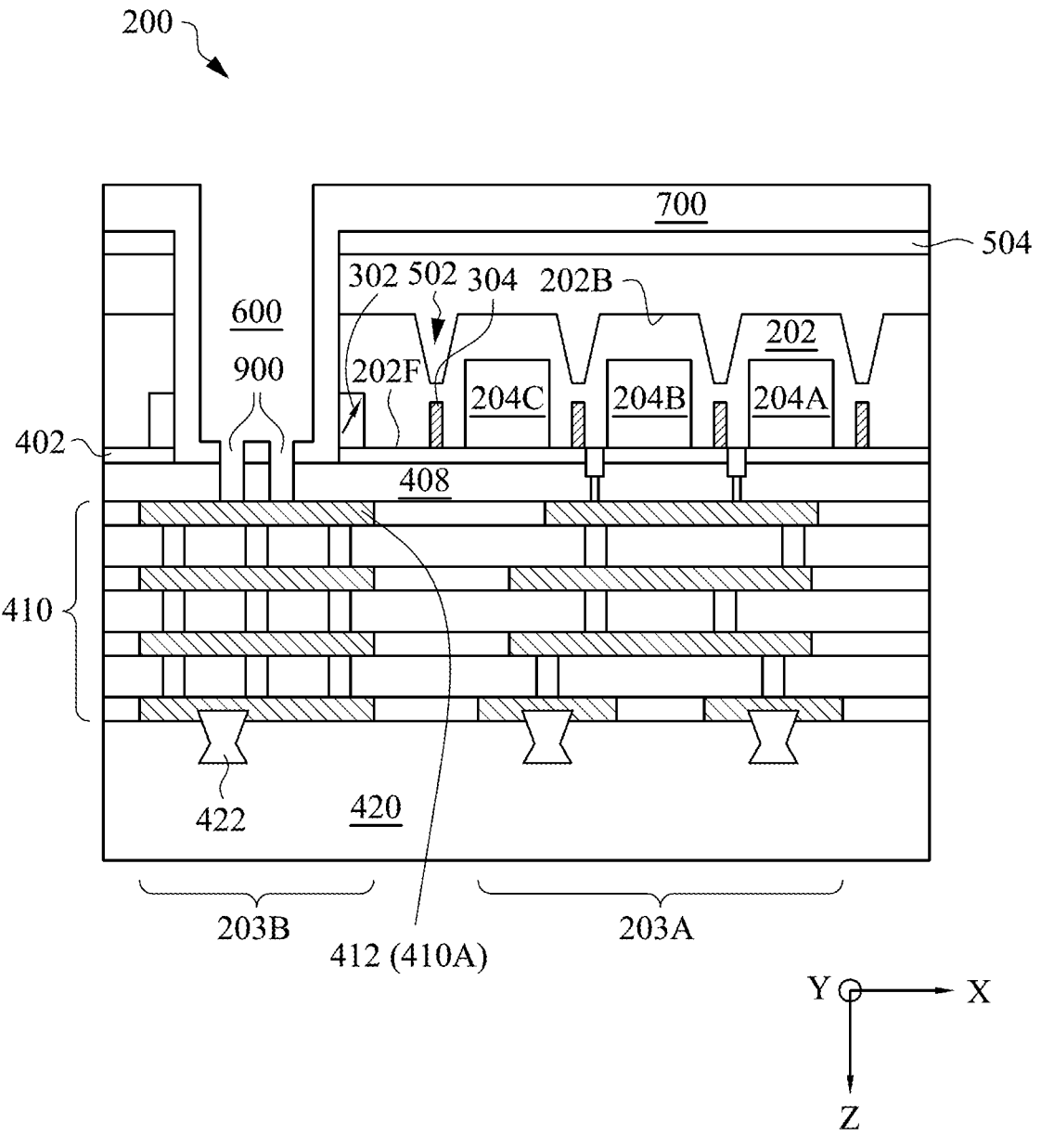

Corresponding to operation 120 of FIG. 1B, FIG. 11 is a cross-sectional view of the BSI image sensor device 200 in which the recesses 900 are further extended at one of the various stages of fabrication. In some embodiments, one or more dry etching processes may be performed, based on the partially etched recesses 900 (FIG. 10), on the buffer oxide layer 700, the ESL 402, and the dielectric layer 408 to extend the recesses 900 so as to expose respective portions of the line 412 of the metallization layer 410A. For example, a first dry etching process—e.g., using tetrafluoromethane ($CF_4$) gas—removes the portions of the buffer oxide layer 700 directly below the recesses 900 and endpoints on the ESL 402. A second dry over-etch process—e.g., using octafluorocyclobutane ($C_4F_8$) gas—removes the ESL 402 to expose the dielectric layer 408 of the device layer 400. A third dry etching process—e.g., using tetrafluoromethane ($CF_4$) gas—removes the portions of the dielectric layer 408 exposed by the recesses 900 and endpoints on the line 412.

Figure 12:
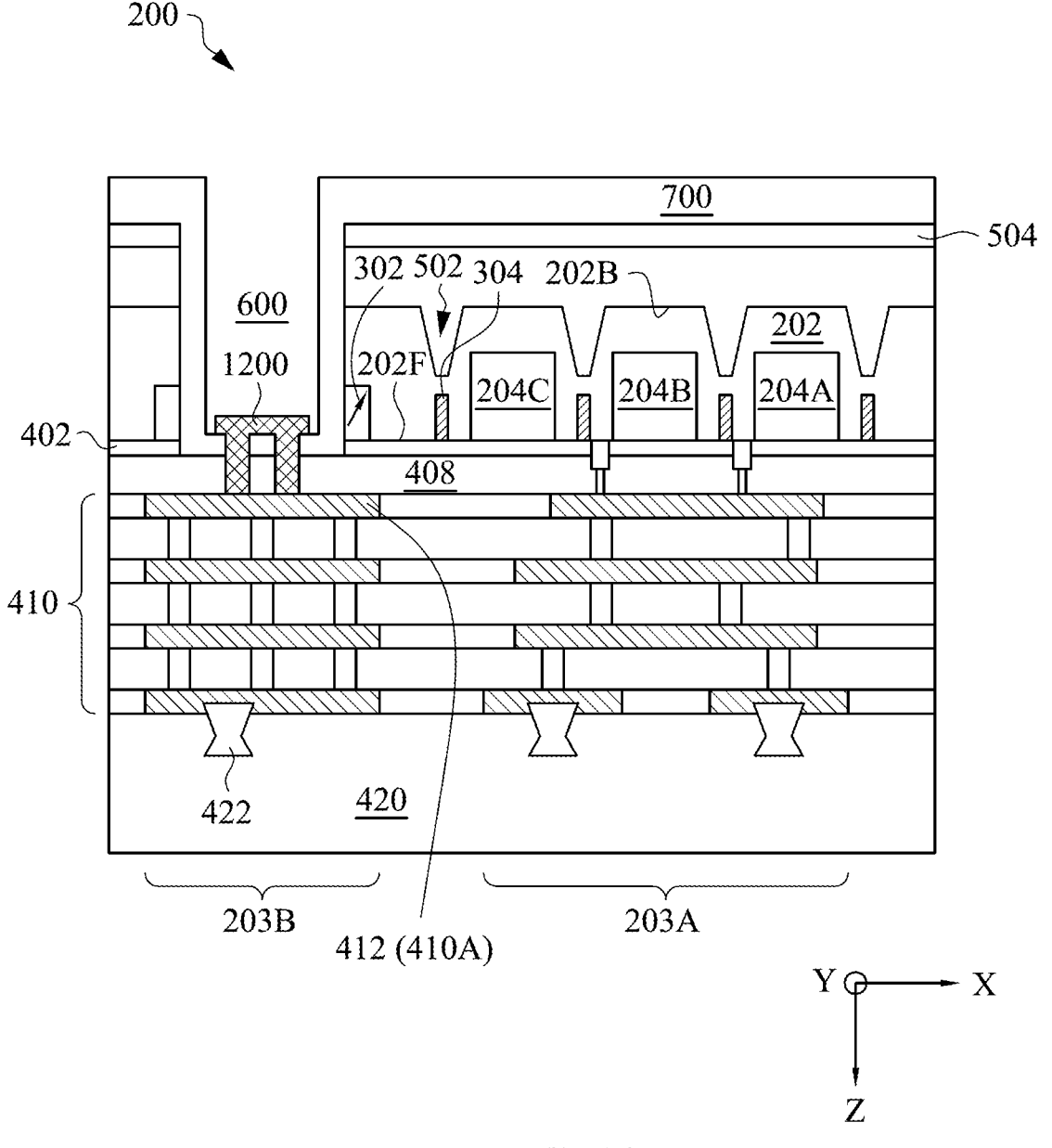

Corresponding to operation 122 of FIG. 1B, FIG. 12 is a cross-sectional view of the BSI image sensor device 200 including one or more pad structures 1200 at one of the various stages of fabrication. In some embodiments, a metal layer can be deposited and subsequently patterned in the opening 600 to form the pad structure 1200. For example, patterning of the metal layer can be accomplished with one or more lithography processes followed by one or more etching processes. In some embodiments, the pad structure 1200 includes a metal alloy—for example, aluminum-copper (AlCu). However, this is not limiting and other suitable metals or metal alloys may be used to form the pad structure 1200.

Figure 13:
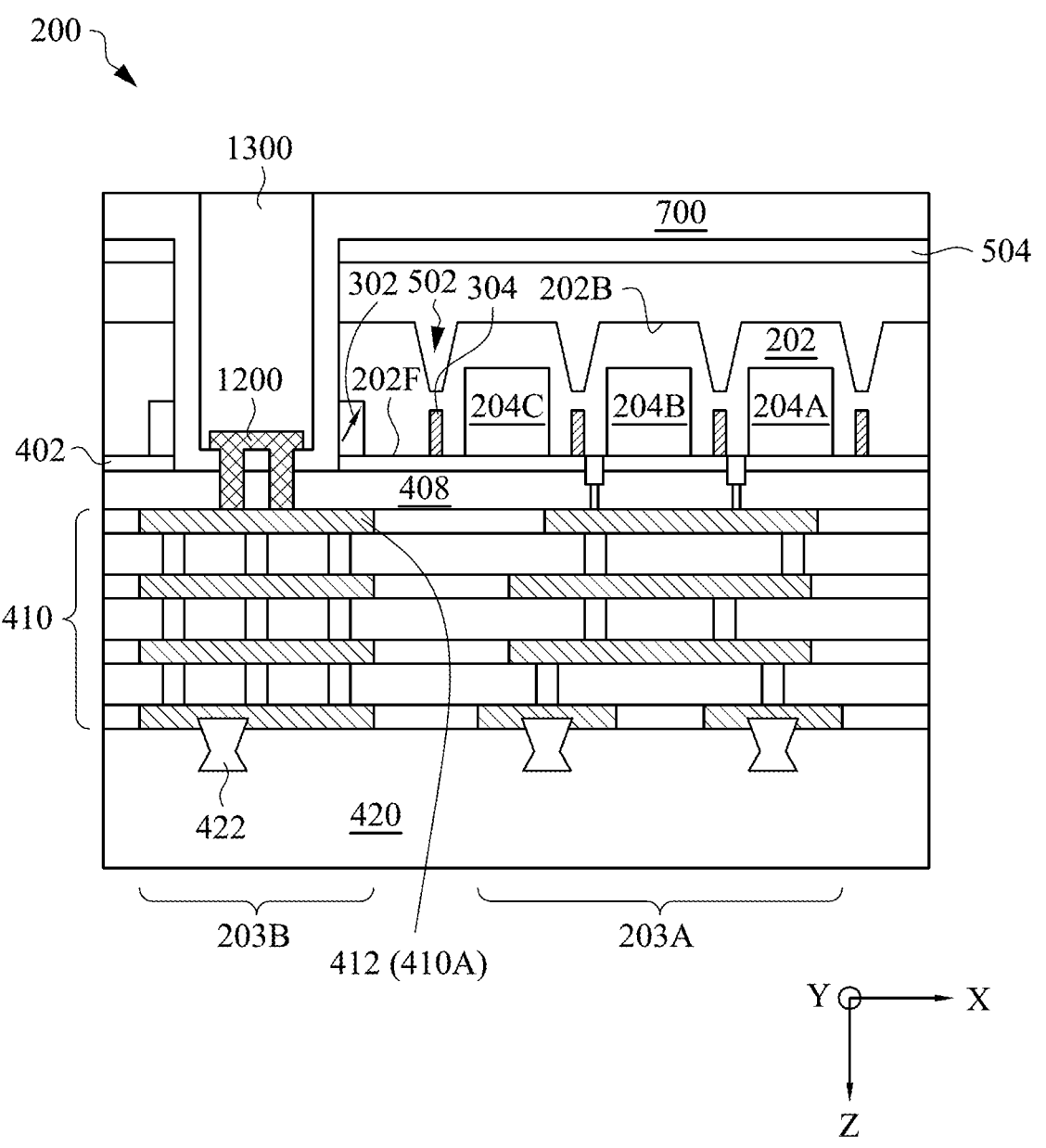

Corresponding to operation 124 of FIG. 1B, FIG. 13 is a cross-sectional view of the BSI image sensor device 200 including a dielectric layer 1300 at one of the various stages of fabrication. In some embodiments, the dielectric layer 1300 (e.g., a USG layer or another oxide) is deposited on the pad structure 1300. A top surface of the dielectric layer 1300 may be dished by a CMP process that polishes and removes deposited amounts of the dielectric layer 1300 on the buffer oxide layer 700.

Figure 14:
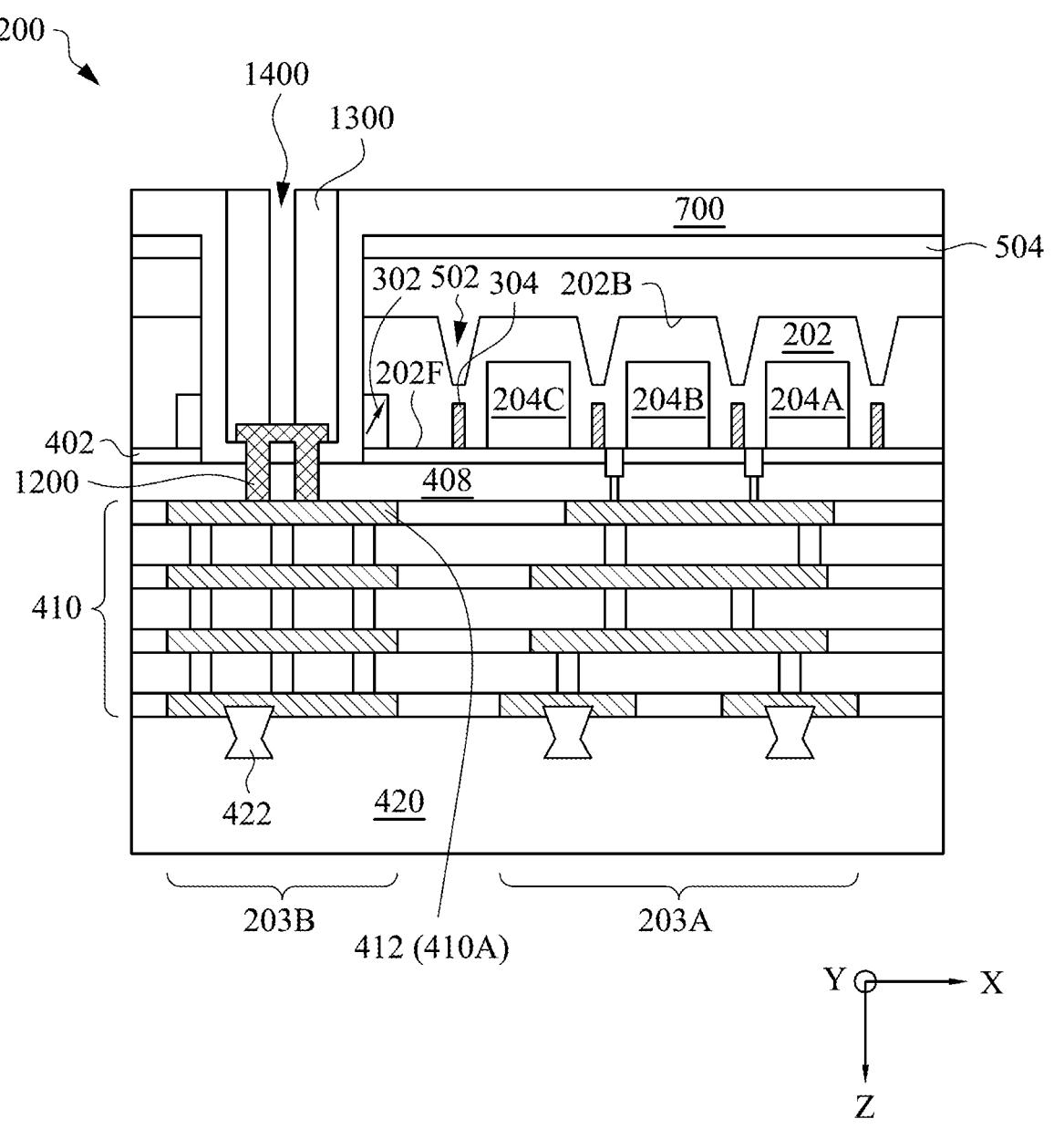

Corresponding to operation 126 of FIG. 1B, FIG. 14 is a cross-sectional view of the BSI image sensor device 200 including an opening 1400 extending through the dielectric layer 1300 at one of the various stages of fabrication. In some embodiments, the dielectric layer 1300 is patterned so that the opening 1400 is formed to expose a portion of the pad structure 1200. By way of example and not limitation, a wire connector, a solder ball, and/or a bond bump, not shown in FIG. 14, can be formed in the opening 1400. According to some embodiments, such a connector structure—through the pad structure 1200—electrically connects the line 412 of the metallization layers 410A to one or more external components.

Figure 15:
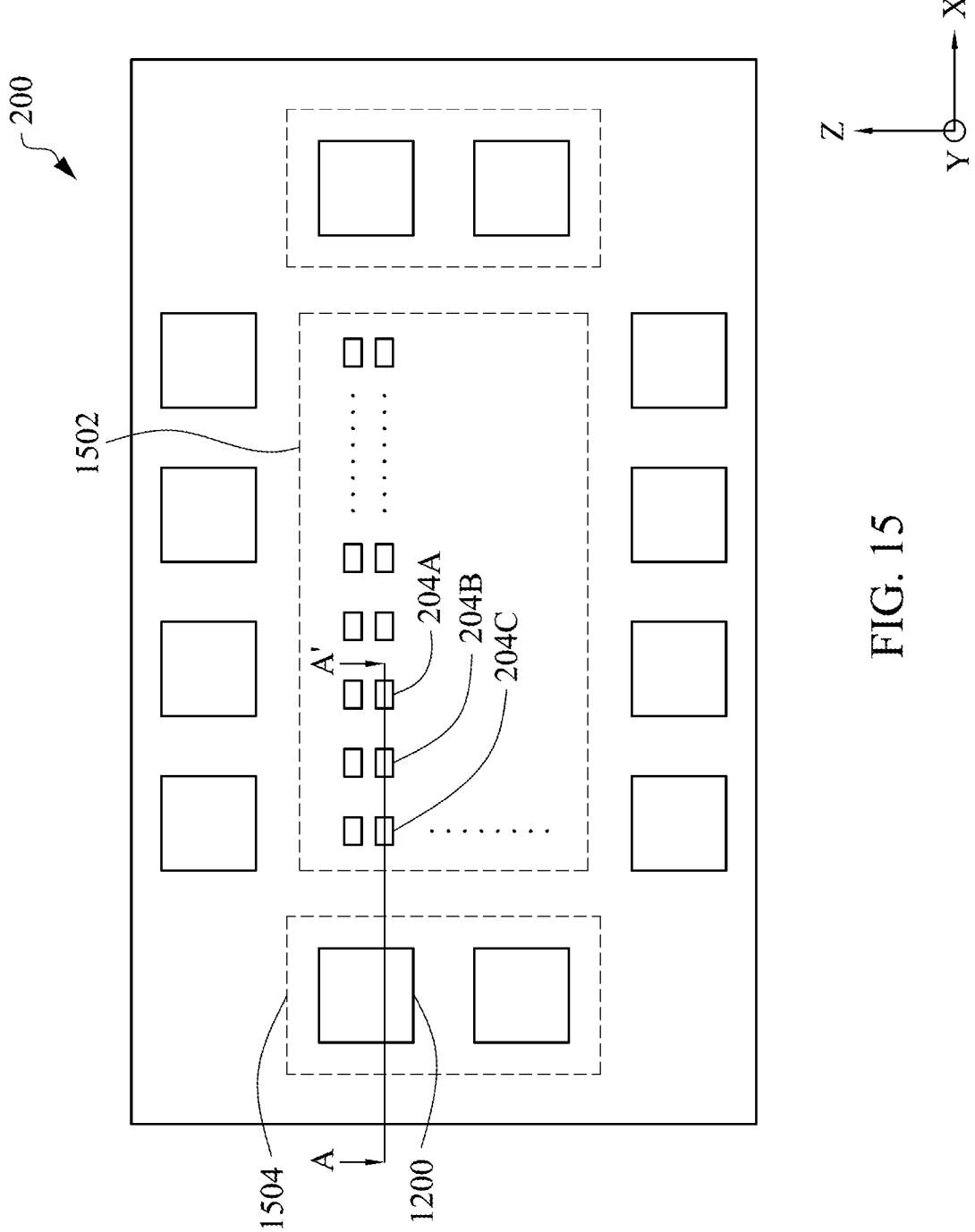
FIG. 15 illustrates a top view of the example image sensor device, illustrated in FIGS. 2-14, in accordance with some embodiments.

Referring to FIG. 15, a top view of the BSI image sensor device 200, viewed from the back surface 202B of the semiconductor substrate 202 is provided. FIGS. 2-14 correspond to the cross-sectional views of the BSI image sensor device 200, cut along line A-A'. As shown, the BSI image sensor device 200 may include other pixels and pad structures that are substantially similar as the pixels 204A-C and the pad structure 1200, respectively. According to various embodiments, such pixels can form a pixel array 1502 laterally surrounded by one or more pad arrays 1504 that each includes one or more of the pad structures 1200.

In one aspect of the present disclosure, a method of making an image sensor device is disclosed. The method includes forming a dielectric layer over a first surface of a semiconductor layer. The dielectric layer includes a conductive structure. The method includes forming an opening, extending from a second surface of the semiconductor layer to the first surface of the semiconductor layer, to expose a portion of the dielectric layer. The second surface of the semiconductor layer is opposite to the first surface of the semiconductor layer. The method includes forming a buffer oxide layer lining the opening, a portion of a first surface of the buffer oxide layer contacting the exposed portion of the dielectric layer. The method includes forming, according to a patternable layer, one or more recesses in the buffer oxide layer that partially extends from a second surface of the buffer oxide layer. The second surface of the buffer oxide layer is opposite to the first surface of the buffer oxide layer; removing the patternable layer. The method includes extending the one or more recesses through the buffer oxide layer and a portion of the dielectric layer to expose respective portions of the conductive structure. The method includes filling the one or more recesses with a conductive material to form one or more pad structures configured to provide electrical connection to the conductive structure.

In another aspect of the present disclosure, a method of making an image sensor device is disclosed. The method includes forming, over a first surface of a semiconductor layer, a plurality of radiation sensing regions. The method includes forming, over the first surface of the semiconductor layer, a sacrificial isolation region surrounding the plurality of radiation sending regions. The method includes forming a dielectric layer over the first surface of the semiconductor layer, the dielectric layer including a conductive structure. The method includes etching a second surface of the semiconductor layer to form an opening that exposes a bottom surface of the isolation region, the second surface of the semiconductor layer being opposite to the first surface of the semiconductor layer. The method includes removing at least a portion of the isolation region to expose the dielectric layer; forming a buffer oxide layer lining the opening. The method includes forming a patternable layer having a pattern in the opening. The method includes forming, according to pattern of the patternable layer, one or more recesses in the buffer oxide layer that partially extends from a second surface of the buffer oxide layer, the second surface of the buffer oxide layer being opposite to a first surface of the buffer oxide layer that contacts the dielectric layer; removing the patternable layer. The method includesetching, based on the one or more recesses, the buffer oxide layer and a portion of the dielectric layer to expose respective portions of the conductive structure. The method includes filling the one or more recesses with a conductive material to form one or more pad structures configured to provide electrical connection to the conductive structure.

In yet another aspect of the present disclosure, a method of making an image sensor device is disclosed. The method includes forming, over a first surface of a semiconductor layer, a plurality of pixels configured to absorb near-infrared radiation from a second surface of the semiconductor layer, the second surface of the semiconductor layer being opposite to the first surface of the semiconductor layer. The method includes forming a dielectric layer over the first surface of the semiconductor layer, the dielectric layer including a conductive structure. The method includes etching the second surface of the semiconductor layer to form an opening, the opening being adjacent to the plurality of pixels. The method includes lining the opening with a buffer oxide layer; forming a patternable layer having a pattern in the opening; forming, according to the pattern of the patternable layer, one or more recesses in the buffer oxide layer that partially extends from a second surface of the buffer oxide layer, the second surface of the buffer oxide layer being opposite to a first surface of the buffer oxide layer that directly contacts the dielectric layer. The method includes ashing the patternable layer using an oxygen-based plasma while keeping the conductive structure covered by at least the buffer oxide layer; etching, based on the one or more recesses, the buffer oxide layer and a portion of the dielectric layer to expose respective portions of the conductive structure. The method includes filling the one or more recesses with a conductive material to form one or more pad structures configured to provide electrical connection to the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

13

What is claimed is:

1. A method, comprising:

forming an opening extending from a second surface of a semiconductor layer to a first surface of the semiconductor layer;

forming a buffer oxide layer lining the opening;

forming, according to a patternable layer, at least one recess in the buffer oxide layer that partially extends into the buffer oxide layer and terminates before a conductive structure disposed below the first surface of the semiconductor layer is exposed;

removing the patternable layer after forming the at least one recess and while the conductive structure remains covered by the buffer oxide layer under the at least one recess; and extending the at least one recess through the buffer oxide layer to expose a corresponding portion of the conductive structure.

2. The method of claim 1, further comprising filling the at least one recess with a conductive material to form at least one pad structure configured to provide electrical connection to the conductive structure.

3. The method of claim 1, wherein at least a portion of the patternable layer has a thickness of at least about 8 μm.

4. The method of claim 1, wherein the semiconductor layer having a thickness of about 3 μm to 6 μm.

5. The method of claim 1, wherein the buffer oxide layer includes a material selected from a group consisting of: silicon oxide, undoped silicate glass (USG), phosphosilicate glass (PSG), borophosphosilicate glass (BPSG), fluorine-doped silicate glass (FSG), and combinations thereof.

6. The method of claim 1, wherein the buffer oxide layer includes polyethyloxazoline (PEOX).

7. The method of claim 1, wherein removing the patternable layer further comprises ashing the patternable layer using an oxygen-based plasma.

8. The method of claim 1, wherein removing the patternable layer is performed in situ or ex situ with forming the at least one recess in the buffer oxide layer.

9. The method of claim 1, wherein extending the at least one recess through the buffer oxide layer further comprises etching the buffer oxide layer using a fluoride-based etching gas.

10. The method of claim 1, wherein the conductive structure includes a lateral copper interconnect structure and a nitride-based conductive layer wrapping the lateral copper interconnect structure.

11. The method of claim 1, further comprising forming one or more radiation sensitive regions in the semiconductor layer, wherein the one or more radiation sensitive regions are surrounded by at least one pad structure.

12. The method of claim 1, further comprising:

forming one or more semiconductor devices along the first surface of the semiconductor layer;

depositing a nitride layer on the first surface of the semiconductor layer, wherein the nitride layer surrounds the one or more semiconductor devices;

depositing a dielectric layer over the nitride layer; and forming the conductive structure in the dielectric layer.

13. A method, comprising:

forming, over a first surface of a semiconductor layer, a plurality of radiation sensing regions;

forming a dielectric layer over the first surface of the semiconductor layer, the dielectric layer including a conductive structure that is disposed below the first surface of the semiconductor layer;

etching through a second surface of the semiconductor layer to form an opening that exposes the dielectric layer;

forming a buffer oxide layer lining the opening;

forming a patternable layer having a pattern in the opening;

forming, according to the pattern of the patternable layer, a recess in the buffer oxide layer that partially extends into the buffer oxide layer and terminates before the conductive structure is exposed;

removing the patternable layer after forming the recess and while the conductive structure remains covered by the buffer oxide layer under the recess;

etching, based on the recess, the buffer oxide layer and a portion of the dielectric layer to expose a corresponding portion of the conductive structure; and filling the recess with a conductive material to form a pad structure.

14. The method of claim 13, wherein removing the patternable layer is performed in situ or ex situ with forming the recess in the buffer oxide layer.

15. The method of claim 13, wherein removing the patternable layer further comprises:

ashing the patternable layer using an oxygen-based plasma.

16. The method of claim 13, further comprising:

forming one or more semiconductor devices over the first surface of the semiconductor layer;

depositing a nitride layer on the first surface of the semiconductor layer, wherein the nitride layer surrounds the one or more semiconductor devices;

depositing the dielectric layer; and forming one or more vertical conductive structures in the dielectric layer to electrically connect the one or more semiconductor devices to the conductive structure.

17. The method of claim 13, wherein the patternable layer has a thickness of at least about 8 μm.

18. The method of claim 12, wherein the semiconductor layer having a thickness of about 3 μm to 6 μm.

19. A method, comprising:

forming, over a first surface of a semiconductor layer, a plurality of pixels configured to absorb radiation from a second surface of the semiconductor layer;

forming a dielectric layer over the first surface of the semiconductor layer, the dielectric layer including a conductive structure that is disposed below the first surface;

etching through the second surface of the semiconductor layer to form an opening laterally spaced from the plurality of pixels;

lining the opening with a buffer oxide layer;

forming a patternable layer having a pattern in the opening;

forming, according to the pattern of the patternable layer, a recess in the buffer oxide layer that partially extends into the buffer oxide layer and terminates before the conductive structure is exposed;

ashing the patternable layer using an oxygen-based plasma while keeping the conductive structure covered by at least the buffer oxide layer after forming the recess and while the conductive structure remains covered by the buffer oxide layer under the recess;

etching, based on the recess, the buffer oxide layer and a portion of the dielectric layer to expose a corresponding portion of the conductive structure; and filling the recess with a conductive material to form a pad structure in electrical contact with the conductive structure.

20. The method of claim 19, wherein the patternable layer has a thickness of at least about 8 μm.

* * * * *